United States Patent
Moscaluk

(10) Patent No.: US 7,279,981 B1
(45) Date of Patent: Oct. 9, 2007

(54) COMPENSATION METHOD FOR LOW VOLTAGE, LOW POWER UNITY GAIN AMPLIFIER

(75) Inventor: Gary Peter Moscaluk, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/925,346

(22) Filed: Aug. 24, 2004

Related U.S. Application Data

(60) Provisional application No. 60/506,658, filed on Sep. 26, 2003.

(51) Int. Cl.
*H03F 3/04* (2006.01)
(52) U.S. Cl. .................. 330/288; 330/292
(58) Field of Classification Search .......... 330/253, 330/257, 288, 292
See application file for complete search history.

(56) References Cited

U.S. PATENT DOCUMENTS

| | | | | |
|---|---|---|---|---|
| 4,485,352 A | * | 11/1984 | Davies et al. | 330/288 |
| 4,774,478 A | * | 9/1988 | Taylor | 330/294 |
| 5,079,514 A | * | 1/1992 | Mijuskovic | 330/253 |
| 5,461,343 A | * | 10/1995 | Foran | 330/288 |
| 5,754,037 A | * | 5/1998 | Ezell et al. | 323/273 |
| 6,538,513 B2 | * | 3/2003 | Godfrey et al. | 330/253 |
| 6,774,722 B2 | * | 8/2004 | Hogervorst | 330/258 |
| 6,788,143 B1 | * | 9/2004 | Chen | 330/253 |

* cited by examiner

*Primary Examiner*—Khanh Van Nguyen
(74) *Attorney, Agent, or Firm*—Dale B. Halling

(57) ABSTRACT

A unity gain amplifier has a current mirror. A compensation circuit has an input coupled to an output of the current mirror. An output transistor has a base coupled to the output of the current mirror and a source of the output transistor is coupled to an output of the compensation circuit. The compensation circuit has a resistor in series with a capacitor.

17 Claims, 4 Drawing Sheets

COMPENSATION METHOD FOR LOW VOLTAGE, LOW POWER UNITY GAIN AMPLIFIER

RELATED APPLICATIONS

The present invention claims priority on provisional patent application Ser. No. 60/506,658, filed on Sep. 26, 2003, entitled "Compensation Method for Low-Voltage, Low-Power Unity Gain Amplifier".

FIELD OF THE INVENTION

The present invention relates generally to the field of electronic amplifiers and more particularly to a unity gain amplifier.

BACKGROUND OF THE INVENTION

Unity gain amplifiers are used in variety of applications. In one application, a unity gain amplifier is used to convert an external power supply voltage to an internal power supply voltage source for an integrated circuit. Often the external power supply voltage has noise that is undesirable. In addition, the external power supply may not be at the correct voltage for the internal circuitry. A unity gain amplifier is used to provide the correct internal voltage. One problem with some previous solutions is that the amplifier exhibits ringing and instability due to overshoot. As a result, any noise on the external power supply and the reference voltage are transferred to the internal power supply. Another previous solution has better noise immunity, but requires a very large compensation capacitor. The large compensation capacitor takes up valuable die space. Both of the previous solutions can be exacerbated by low power, low voltage constraints.

Thus there exists a need for a unity gain amplifier that does not exhibit stability problems and does not require a huge compensation capacitor.

SUMMARY OF INVENTION

A unity gain amplifier that overcomes these and other problems has a current mirror. A compensation circuit has an input coupled to an output of the current mirror. An output transistor has a base coupled to the output of the current mirror and a source of the output transistor is coupled to an output of the compensation circuit. The compensation circuit may be a resistor in series with a capacitor. The capacitor may be a transistor with a source coupled to a drain of the transistor. A gate of the transistor may be coupled to the resistor. A first leg of the current mirror has an input transistor. The input transistor has a gate coupled to an input voltage. An output of the amplifier may be coupled to the drain of the output transistor.

In one embodiment, a unity gain amplifier has a compensation circuit having an input coupled to an input signal. An output transistor has a gate coupled to an input of the compensation circuit and a source of the output transistor is coupled to an output of the compensation circuit. A current mirror may be coupled between the input signal and the input of the compensation circuit. The compensation circuit may have a resistor in series with a capacitor. The source of the output transistor may be coupled to a power supply voltage. A drain of the output transistor may form an output of the amplifier. The input signal may be a reference voltage. The input signal may be coupled to an input transistor in a first leg of a current mirror. A voltage of an output signal may be the same as the reference voltage.

In one embodiment, a unity gain amplifier includes a current mirror with an input coupled to an input signal. A compensation circuit has an input coupled to an output of the current mirror. An output transistor has a source coupled to an output of the compensation circuit and to a power supply voltage. The compensation circuit includes a resistor in series with a capacitor. The capacitor may be a transistor having a gate coupled to the resistor and a source coupled to a drain of the transistor. An input signal may be a reference voltage. The current mirror has an input transistor in a first leg of the current mirror and a gate of the transistor is coupled to the input signal. A gate of the output transistor may be coupled to an output of the current mirror.

DETAILED DESCRIPTION OF THE DRAWINGS

The unity gain amplifier described herein has increased stability and power supply rejection ratio (PSRR) without the penalty of a large compensation capacitor. Power supply rejection ratio (PSRR) is a measure of how susceptible the unity gain amplifier is to noise generated from the power supply source. A good power supply rejection ratio (PSRR) must be minimized as much as possible as well as obtaining good stability characteristics. In one embodiment, the required phase margin required by the amplifier is sixty degrees. The unity gain amplifier described herein has an excellent power supply rejection ratio (PSRR) and meets the required stability phase margin. Note that the "unity" means that the voltage is not amplified. The unity gain amplifier described herein does result in current amplification in terms of the output being able to source or sink the desired current.

Figure 1:
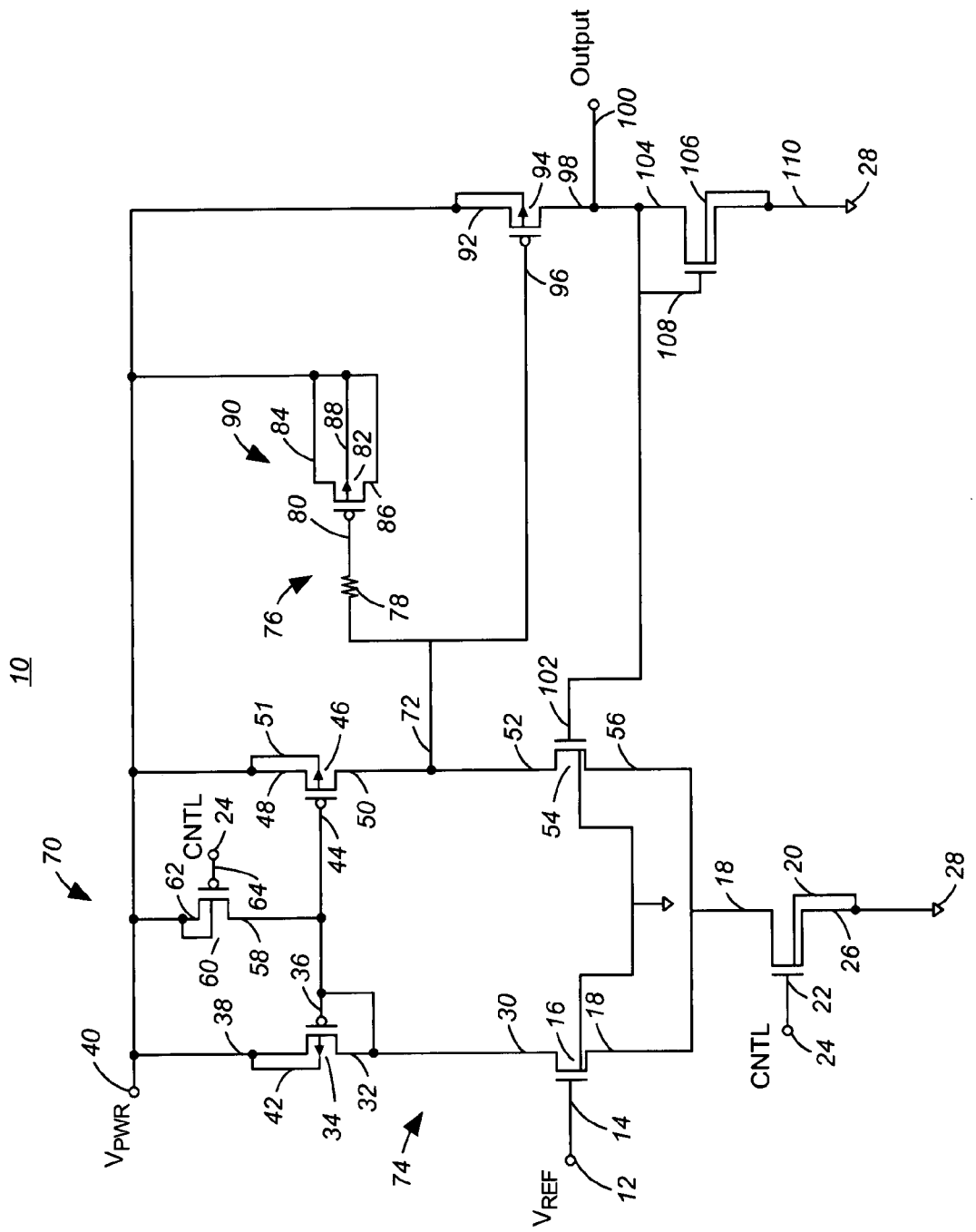
FIG. 1 is a circuit diagram of a unity gain amplifier in accordance with one embodiment of the invention.

FIG. 1 is a circuit diagram of a unity gain amplifier 10 in accordance with one embodiment of the invention. The unity gain amplifier 10 has a reference voltage 12 as the input to the amplifier 10. In one embodiment, the reference voltage is equal to a band gap voltage of the circuitry of the integrated circuit. In one embodiment, this voltage is around 1.2 volts. The reference voltage 12 is coupled to a gate 14 of an n-channel FET (Field Effect Transistor) 16. The source 18 of the input transistor 16 is coupled to a drain 18 of a control transistor 20. The control transistor 20 is an n-channel FET (Field Effect Transistor). The gate 22 of the control transistor 20 is coupled to a control signal 24. The source 26 of the control transistor 20 is coupled to a ground 28 of the circuit 10.

The drain 30 of the input transistor 16 is coupled to a drain 32 of a p-channel FET (Field Effect Transistor) 34. The drain 30 of the input transistor 16 is also coupled to a gate 36 of the transistor 34. A source 38 of the transistor 34 is coupled to an external power supply voltage (VPWR) 40. The external power supply voltage 40 has a voltage that is greater than the voltage of the reference voltage 12. In one embodiment, the external power supply voltage is around 2.6 volts. The source 38 is also coupled to the bulk of transistor 34 and this is shown by conductor 42. The gate 36 of transistor 34 is coupled to the gate 44 of a p-channel FET (Field Effect Transistor) 46. The source 48 of transistor 46 is coupled to the external power supply voltage (VPWR) 40. The source 48 is also coupled to the bulk of transistor 46 and this shown by conductor 51. The drain 50 of transistor 46 is coupled to a drain 52 of an n-channel FET (Field Effect Transistor) 54. The source 56 of transistor 54 is coupled to a drain 18 of transistor 20. Note that the n-channel FETs (Field Effect Transistors) 16 & 54 may also have their bulks tied to ground.

The gate 36 of transistor 34 and the gate 44 of transistor 46 are coupled to a drain 58 of a p-channel FET (Field Effect Transistor) 60. A source 62 of transistor 60 is coupled to the external power supply voltage 40. A gate 64 of transistor 60 is coupled to the control signal 24. Transistors 16, 34, 46, 54 form a current mirror 70. The transistors 20 & 60 allow the current mirror 70 to be turned on or off by the control signal 24. The input to the current mirror 70 is the reference voltage 12 and the output 72 is coupled to the drain 50 of transistor 46. The first leg 74 of the current mirror 70 includes the transistors 34 and 16.

The output 72 of the current mirror 70 is coupled to a compensation circuit 76. The compensation circuit 76 has a resistor 78 with a first end coupled to the output 72 of the current mirror 70. The second end of the resistor 78 is coupled to a gate 80 of a p-channel FET (Field Effect Transistor) 82. The p-channel can be replaced with an n-channel transistor or any other type of capacitor desired. The source 84 of transistor 82 is coupled to a drain 86 of transistor 82. The source 84 of transistor 82 is also coupled to the external power supply voltage 40. The substrate of transistor 82 is coupled to the source 84 of transistor 82 by a conductor 88. The transistor 82 is electrically connected to function as a capacitor 90. In another embodiment, the transistor 82 is replaced by a conventional capacitor. The compensation circuit 76 has a resistor 78 in series with a capacitor 90. One end of the resistor 78 is the input to the compensation circuit 76 and the source 84 of the transistor 82 coupled as a capacitor forms the output that is coupled to a source 92 of the p-channel FET (Field Effect Transistor) 94. The output transistor 94 has a gate 96 coupled to the output 72 of the current mirror 70. A drain 98 of the output transistor 94 is coupled to an output 100 of the unity gain amplifier and to the gate 102 of transistor 54. The drain 98 is also coupled to a source 104 of the n-channel FET (Field Effect Transistor) 106 and to the gate 108 of transistor 106. The source 110 of transistor 106 is coupled to ground 28. The transistor 106 is electrically configured as a diode.

In standby mode, the control input 24 is low, which turns on transistor 60 and turns off transistor 20, supplying VPWR on the gate of transistor 34 and 46. Therefore, there is no current consumption present in the amplifier.

In operation, the control input 24 goes high, which turns off transistor 60 and turns on transistor 20. Since the input signal 12, VREF, is at a constant analog voltage of approximately 1.2v, transistor 16 begins to conduct pulling the drain/gate node of transistor 34 towards ground which turns on transistor 34 supplying an intermediate voltage on the first leg 74 of the current mirror. The current in the first leg 74 of the current mirror 70 is mirrored in the second leg which consists of transistors 46 and 54, which will supply an intermediate voltage on output 72 at approximately a VPWR-Vtp (PCH threshold voltage). The output 72 is connected to the gate of transistor 94 as well as the compensation circuit 76. Therefore, transistor 94 turns on raising the output 100, subsequently turning on the diode connected transistor 106. This output voltage is fed back to the gate of transistor 54 and continues to rise until the voltage at output 100 equals the input VREF 12. The purpose of the compensation circuit 76 is to provide stability to the amplifier in terms of power supply rejection and internal noise generated at the output of the amplifier since the output is negatively fed back to the first stage of the amplifier.

Figure 2:
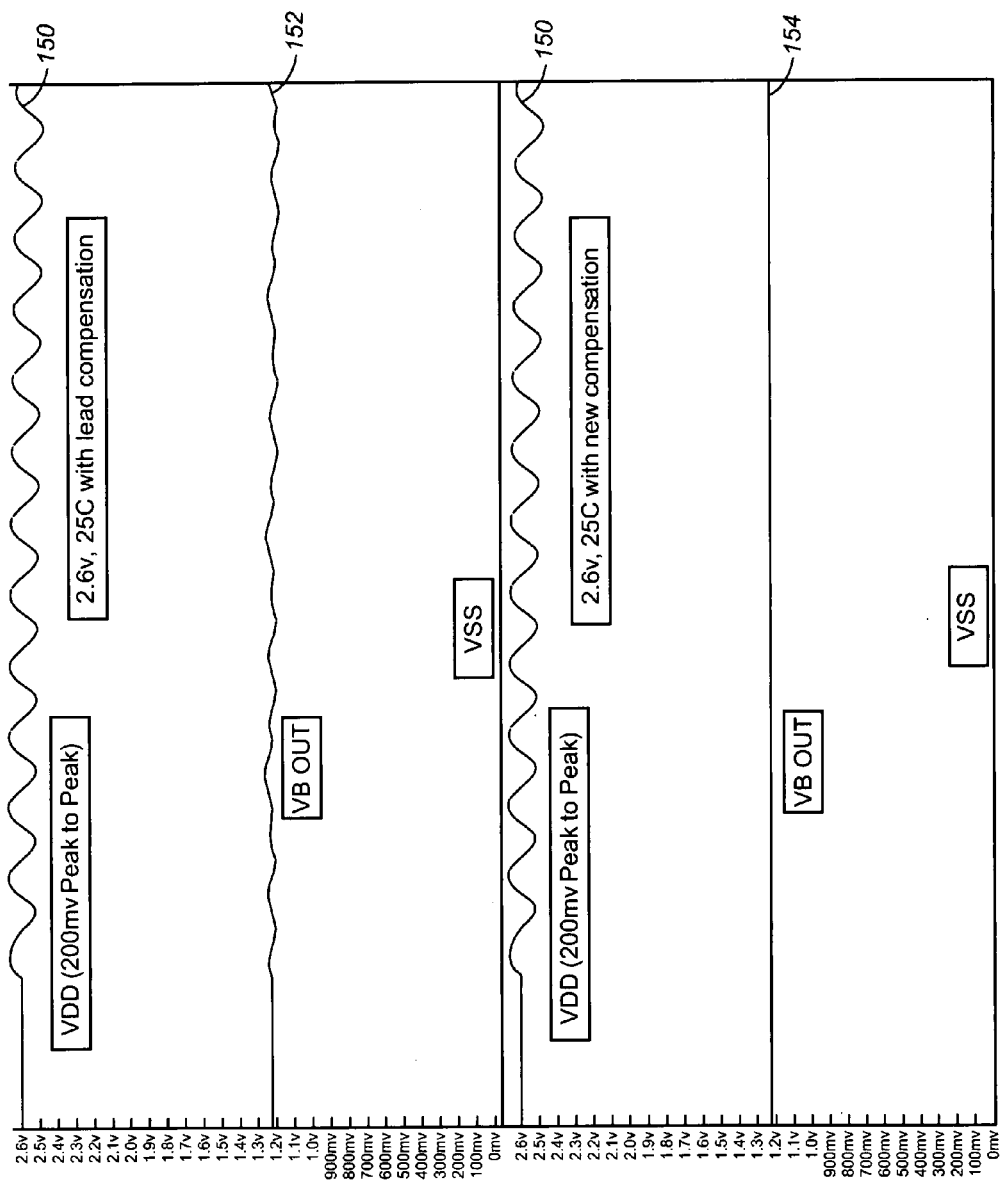
FIG. 2 is a graph of a simulation of a previous design's output compared to the output of the unity gain amplifier of FIG. 1 in accordance with one embodiment of the invention.

FIG. 2 is a graph of a simulation of a previous design's output compared to the output of the unity gain amplifier of FIG. 1 in accordance with one embodiment of the invention. The top signal (and middle signal) 150 of the graph is the external power supply voltage (VPWR). This signal is a 2.6 volt signal with a 200 millivolt peak-to-peak sinusoid. The next trace 152 is the output of a previous unity gain amplifier. The lowest trace 154 is the output of the unity gain amplifier describe in FIG. 1. The output 154 shows that the present invention significantly reduces the noise of the input signal 150 compared to the previous designs. This is accomplished without the penalty of using a very large capacitor. The output traces 152, 154 are nominally 1.2 volt signals.

Figure 3:
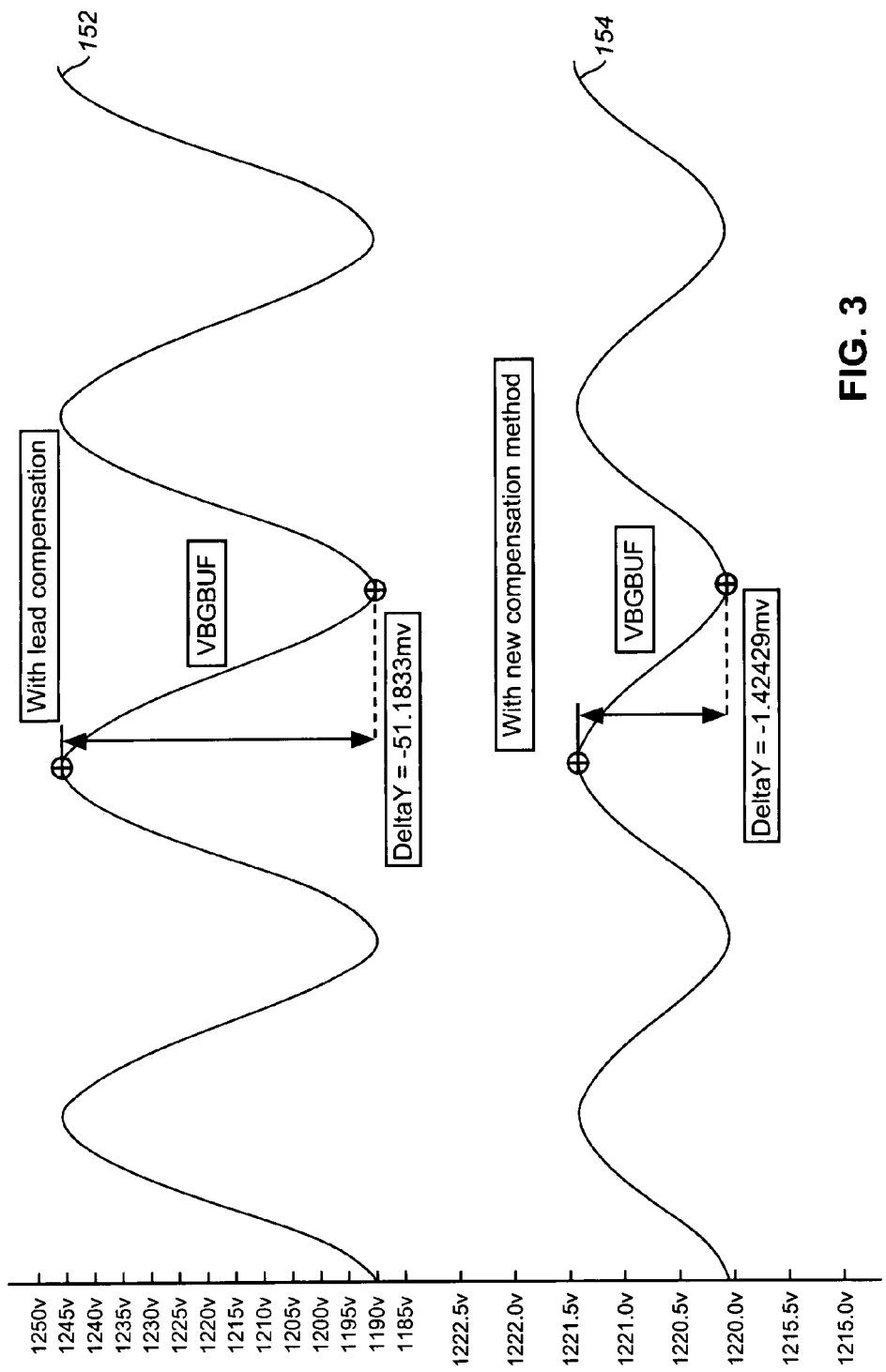
FIG. 3 is a graph of a simulation of a previous design's output compared to the output of the unity gain amplifier of FIG. 1 in accordance with one embodiment of the invention.

FIG. 3 is a graph of a simulation of a previous design's output compared to the output of the unity gain amplifier of FIG. 1 in accordance with one embodiment of the invention. This graph is an exploded view of the output signals 152 and 154 of FIG. 2. Note that the scale for the top trace 152 is different from the scale for the lower trace 154. The peak to peak variation of the previous design is 52 millivolts. The peak to peak variation of the present invention is 1.4 millivolts. The unity gain amplifier is 37 times better at eliminating the sinusoidal noise of the input power supply signal, than the previous design in rejecting noise.

Figure 4A:
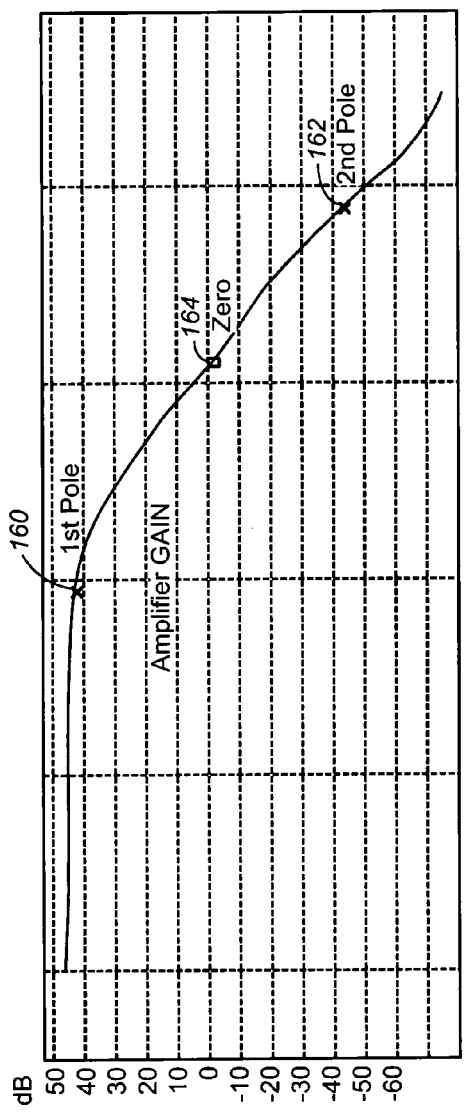
FIG. 4a is a gain versus frequency plot in accordance with one embodiment of the invention.
Figure 4B:
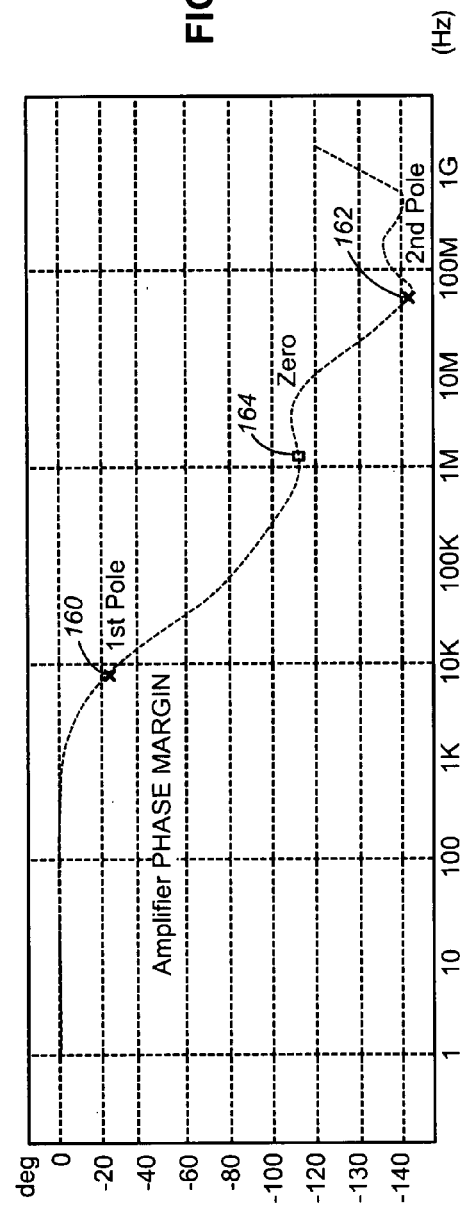
FIG. 4b is a phase versus frequency plot in accordance with one embodiment of the invention.

FIG. 4a is a gain versus frequency plot in accordance with one embodiment of the invention and FIG. 4b is a phase versus frequency plot in accordance with one embodiment of the invention. These diagrams that form a Bode plot. The Bode plot shows that the phase margin for the circuit is greater than 60 degrees. The phase margin is the difference in the phase shift at unity gain (zero decibels) and a negative 180 degrees. Here the phase shift is a negative 125 degrees at zero gain, which is a phase margin of 65 degrees. The phase margin is a measure of the stability of the circuit and correlates to overshoot and oscillation or ringing at the output of the amplifier. Generally, a phase margin of 60 degrees or greater is considered to be an acceptable stable circuit. This means that there will be very little ringing or overshoot associated with the unity gain amplifier described herein. The unity gain amplifier has a resistor and a capacitor in the compensation network. This results in a two pole 160, 162, one zero 164 unity gain amplifier. The zero 164 increases the phase margin of the unity gain amplifier when designed to perform at desired frequencies.

Thus there has been described unity gain amplifier that has good stability characteristics and good power supply rejection ratio (PSRR) and does not require a large capacitor as part of the compensation circuit.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A unity gain amplifier, comprising:
   a current mirror having an input coupled to a reference voltage;
   a compensation circuit having an input coupled to an output of the current mirror, the compensation circuit including a resistor and a capacitor; and
   an output transistor having a gate, the gate coupled to the output of the current mirror and a source of the output transistor coupled to an output of the compensation circuit, a drain of the output transistor forming an output of the unity gain amplifier wherein a voltage at the output of the unity gain amplifier is equal to the voltage of the input of the unity gain amplifier which is the input of the current mirror.

2. The amplifier of claim 1, wherein the compensation circuit comprises the resistor in series with the capacitor.

3. The amplifier of claim 2, wherein the capacitor is a transistor having a source coupled to a drain of the transistor.

4. The amplifier of claim 3, wherein a gate of the transistor is coupled to the resistor.

5. The amplifier of claim 1, wherein a first leg of the current mirror has an input transistor, the input transistor having a gate coupled to an input voltage.

6. The amplifier of claim 1, wherein an output of the unity gain amplifier is coupled to the drain of the output transistor.

7. A unity gain amplifier, comprising:
   a compensation circuit having an input coupled to an input signal, the compensation circuit having a resistor and a capacitor; and
   an output transistor having a gate directly electrically coupled to an input of the compensation circuit and a source of the output transistor coupled to an output of the compensation circuit, a drain of the output transistor forming the output of the unity gain amplifier wherein a voltage at the output of the unity gain amplifier is equal to the voltage of the input signal of the unity gain amplifier which is the input of a current mirror and wherein the input signal is a reference voltage.

8. The amplifier of claim 7, further including the current mirror coupled between the input signal and the input of the compensation circuit.

9. The amplifier of claim 8, wherein the compensation circuit comprises the resistor in series with the capacitor.

10. The amplifier of claim 7, wherein the source of the output transistor is coupled to a power supply voltage.

11. The amplifier of claim 7, wherein the input signal is coupled to an input transistor in a first leg of the current mirror.

12. The amplifier of claim 7, wherein a voltage of an output signal is the same as the reference voltage.

13. A unity gain amplifier, comprising:
   a current mirror having an input coupled to an input reference signal;
   a compensation circuit having an input coupled to an output of the current mirror, the compensation circuit including a resistor and a capacitor; and
   an output transistor having a source coupled to an output of the compensation circuit and to a power supply voltage, a drain of the output transistor forming the output of the unity gain amplifier wherein a voltage at the output of the unity gain amplifier is equal to the voltage of the input signal of the unity gain amplifier which is the input of the current mirror.

14. The amplifier of claim 13, wherein the compensation circuit has the resistor in series with the capacitor.

15. The amplifier of claim 14, wherein the capacitor is a transistor having a gate coupled to the resistor and a source coupled to a drain of the transistor.

16. The amplifier of claim 13, wherein the current mirror has an input transistor in a first leg of the current mirror and a gate of the transistor is coupled to the input signal.

17. The amplifier of claim 13, wherein a gate of the output transistor is coupled to an output of the current mirror.

\* \* \* \* \*